US008760891B2

(12) United States Patent
Lloyd et al.

(10) Patent No.: US 8,760,891 B2
(45) Date of Patent: Jun. 24, 2014

(54) REAL TIME DYNAMIC OPTIMIZATION OF DEADTIME

(75) Inventors: Sonny Lloyd, Cambridge (CA); Nicolae Morcov, Mississauga (CA); Michael Andreou, Oakville (CA); Dikran Yaldizciyan, Maple (CA)

(73) Assignee: Honeywell International Inc., Morristown, NJ (US)

( * ) Notice: Subject to any disclaimer, the term of this patent is extended or adjusted under 35 U.S.C. 154(b) by 263 days.

(21) Appl. No.: 12/793,596

(22) Filed: Jun. 3, 2010

(65) Prior Publication Data

US 2011/0298527 A1 Dec. 8, 2011

(51) Int. Cl.
*H02H 7/122* (2006.01)

(52) U.S. Cl.
USPC .................................................. 363/56.04

(58) Field of Classification Search
USPC .................. 363/56.04; 323/224, 282, 284
See application file for complete search history.

(56) References Cited

U.S. PATENT DOCUMENTS

| 4,215,279 | A | 7/1980 | Lataire et al. |
| 6,018,154 | A | 1/2000 | Izaki et al. |
| 6,172,550 | B1 * | 1/2001 | Gold et al. ............... 327/366 |
| 6,288,605 | B1 | 9/2001 | Botti et al. |
| 6,535,402 | B1 | 3/2003 | Ying et al. |
| 6,678,180 | B2 * | 1/2004 | Matsuda ..................... 363/132 |
| 6,714,424 | B2 | 3/2004 | Deng et al. |
| 6,927,988 | B2 * | 8/2005 | Cheng et al. ............. 363/56.04 |
| 7,053,632 | B1 | 5/2006 | Liang et al. |
| 7,456,623 | B2 | 11/2008 | Hasegawa et al. |
| 7,622,904 | B2 * | 11/2009 | Sutardja et al. ............. 323/282 |
| 7,791,912 | B2 * | 9/2010 | Walde ....................... 363/56.04 |
| 2002/0101751 | A1 * | 8/2002 | Wade ......................... 363/125 |
| 2009/0027021 | A1 | 1/2009 | Dequina |

FOREIGN PATENT DOCUMENTS

GB 2432732 5/2007

OTHER PUBLICATIONS

Bin Zhang, A Novel IGBT Gate Driver to Eliminate the Dead-Time Effect, Oct. 2005, IEEE Xplore, vol. 2, pp. 913-917.*

* cited by examiner

*Primary Examiner* — Adolf Berhane
(74) *Attorney, Agent, or Firm* — Shimokaji & Assoc., P.C.

(57) ABSTRACT

A deadtime optimization apparatus and method may determine when it is safe to turn a switch ON, eliminating the need to have a switch controller purposely insert a deadtime period in the algorithm (i.e., it can go back to producing ideal PWM). Since the decision of when it is safe to turn ON the switch may be achieved through measurement, it is expected that the length of time may change for each pulse as the operating conditions change. Therefore, the apparatus and methods of the present invention may take on a dynamic characteristic because the safe to turn ON (STTO) time may vary for each pulse.

13 Claims, 8 Drawing Sheets

PWM WITH DEADTIME INSERTION

US 8,760,891 B2

REAL TIME DYNAMIC OPTIMIZATION OF DEADTIME

BACKGROUND OF THE INVENTION

The present invention relates to apparatus and methods for power conversion and, more particularly, to apparatus and methods for real time dynamic optimization of deadtime in power conversion circuits.

In modern power inverter/converter technology, a switching power device, such as an insulated gate bipolar transistor (IGBT) or a metal oxide semiconductor field effect transistor (MOSFET), is often utilized to convert direct-current (DC) power into alternating-current (AC) power. A pulse width modulated (PWM) method is widely adopted in switching pattern control.

In voltage source application, the deadtime period is used to ensure that there is sufficient delay before actually turning a switch ON so that it is not possible to have both devices conducting simultaneously, causing a shoot-through fault condition. Essentially, the deadtime period is an arbitrary way to determine when it is safe to turn ON a switch. Often, conventional systems will not have any measured value confirming that it is safe to turn ON and will rely solely on a worst case statistical means to make a decision. In conventional systems, the deadtime period is a fixed value of time which provides sufficient delay to accommodate the worst case conditions.

An example of a two switch phase-leg configuration including the ideal gating commands, for example pulse width modulation (PWM), is shown in FIG. 1, which forms the basic building block of many power electronic topologies for both DC/DC and DC/AC voltage source conversion. In this configuration, specifically the adjacency of upper switch 100 (S1) and lower switch 102 (S2), it is required that the switches 100, 102 never conduct simultaneously but rather in a complementary fashion, thus avoiding a potential short-circuit fault condition. The need for a time delay (commonly referred to as deadtime) between the upper and lower switch in a single phase-leg is justified because it reduces the chance both adjacent devices conduct simultaneously. Deadtime insertion is a common practice in the industry used avoid the potential of a short-circuit fault condition for voltage source applications and is typically implemented in the digital controller i.e., by inserting a fixed time delay on the rising edge of each gating commands as shown in FIG. 2.

Although deadtime insertion lowers the probability of a shoot-through fault, it introduces new characteristics into the system, such as: (a) low frequency harmonics (multiples of the fundamental waveform) which may decrease system efficiency and increase heat generated in the load, (b) nonlinearity which can cause sensorless control and flux estimation controller errors, and (c) decreased fundamental voltage.

There are many deadtime compensation techniques that have been widely reported in the open literature. Generally speaking, this type of solution involves a modification of the PWM signal for the purpose of producing an increased or decreased average voltage at the output (Vout). Although this type of solution has reported a reduction in the low frequency harmonics because of the effectiveness of their compensation methods; it is often not reported that a new problem is introduced, that the DC bus utilization has dropped to accommodate for the deadtime compensation method.

In the aerospace industry (for example), the DC bus utilization is vitally important as every opportunity to minimize weight and volume of the system components must be taken. It may not be acceptable for some sensitive applications to make use of deadtime compensation techniques which may lower the DC bus utilization. It is important to note that the method proposed here within does not suffer a large DC bus utilization impact.

As can be seen, there is a need for apparatus and methods for optimizing deadtime which may result in reduced low frequency harmonics, reduced nonlinearity and increased fundamental voltage.

SUMMARY OF THE INVENTION

In one aspect of the present invention, a conduction detection circuit comprises a pulse width modulator (PWM) generating a pulse; an upper and a lower logic circuit receiving the pulse; an upper and lower gate driver receiving an output from respective upper and lower logic circuits; an upper and lower switch receiving a gating signal from respective upper and lower gate drivers; and an upper and lower comparator determining the conduction state of respective upper and lower switches.

In another aspect of the present invention, a conduction detection circuit comprises a pulse width modulator (PWM) generating a pulse; an upper and a lower logic circuit receiving the pulse; an upper and lower gate driver receiving an output from respective upper and lower logic circuits; an upper and lower IGBTs receiving a gating signal from respective upper and lower gate drivers; and an upper and lower comparator determining the conduction state of respective upper and lower switches, wherein the upper and lower logic circuit determines if its respective upper and lower IGBT is in a state which will not cause a shoot-through if the respective upper and lower gate driver turns ON, and wherein the conduction state of respective upper and lower switches is selected from the group consisting of IGBT conducting (state 1), diode conducting (state 2) and device off (state 3).

In a further aspect of the present invention, a method for dynamically optimizing deadtime in switching between upper and lower switches comprises sensing collector-emitter voltage of each of the upper and lower switches; determining a conduction state of each of the upper and lower switches based on the sensed collector-emitter voltage; determining if the upper and lower switches are in a state which will not cause a shoot-through if a corresponding gate driver turns the switch ON; and switching ON one of the upper and lower switches when the switch is not in a state that will cause a shoot-through.

These and other features, aspects and advantages of the present invention will become better understood with reference to the following drawings, description and claims.

DETAILED DESCRIPTION OF THE INVENTION

Figure 1A:
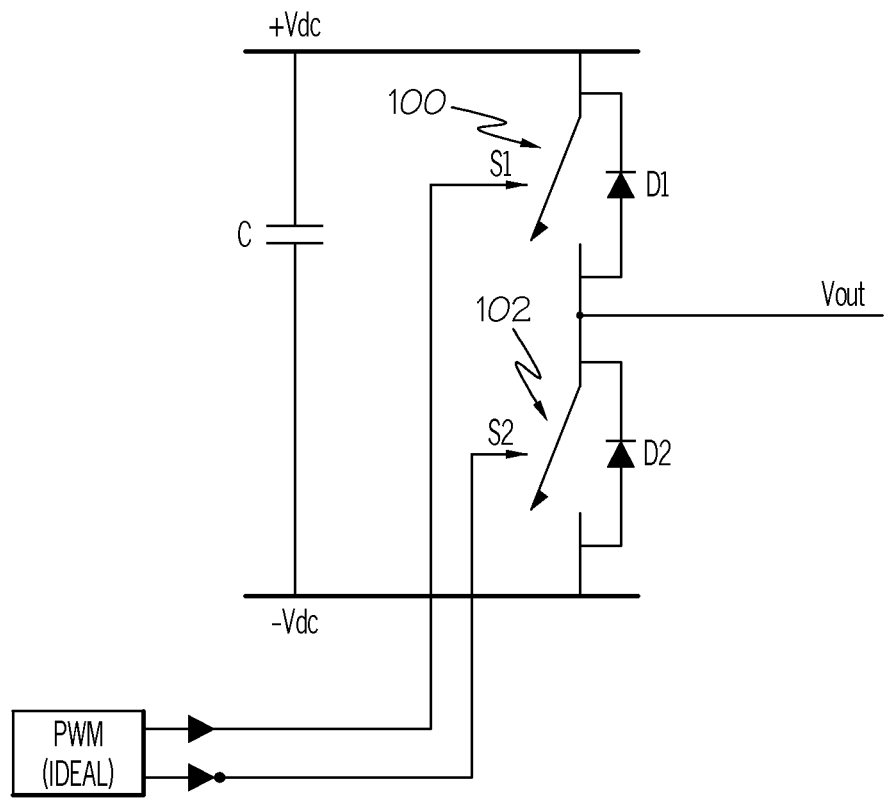
FIG. 1A is a schematic drawing of a phase-leg building block with an ideal PWM according to the prior art.
Figure 1B:
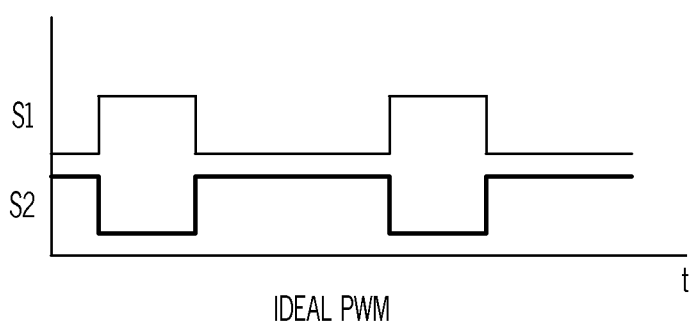
FIG. 1B is a graph of switch status over time for the phase-leg building block of FIG. 1A.
Figure 2A:
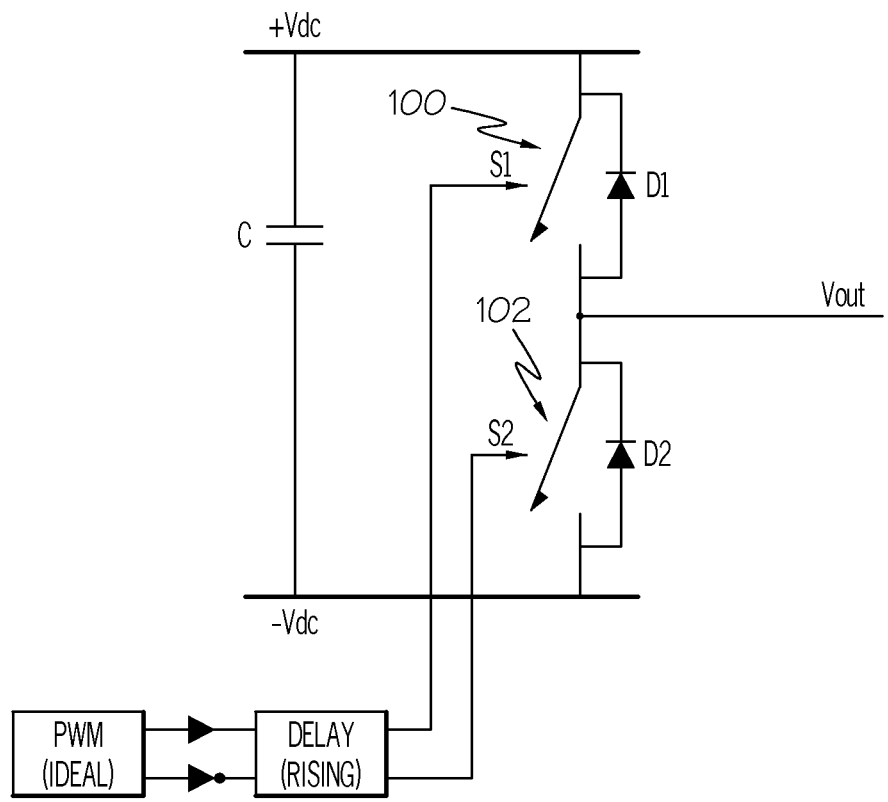
FIG. 2A is a schematic drawing of a phase-leg building block with a non-ideal PWM according to the prior art.
Figure 2B:
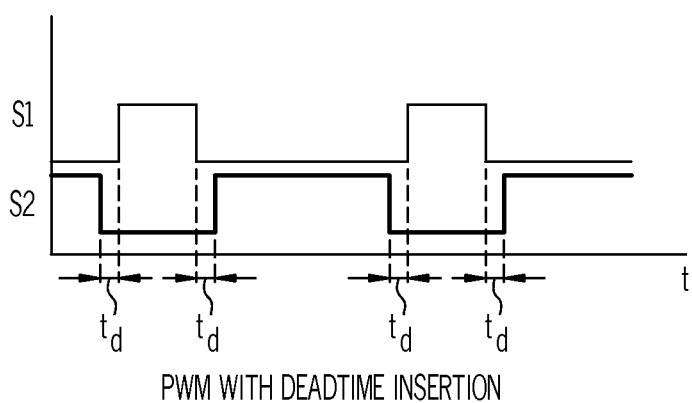
FIG. 2B is a graph of switch status over time for the phase-leg building block of FIG. 2A.

The following detailed description is of the best currently contemplated modes of carrying out exemplary embodiments of the invention. The description is not to be taken in a limiting sense, but is made merely for the purpose of illustrating the general principles of the invention, since the scope of the invention is best defined by the appended claims.

a means of communication between adjacent gate drives. Any means which is fast and reliable is possible. A typical method is indicated by communication path 16 in FIG. 3 because this path crosses the communication boundary 26 only once resulting in the least amount of propagation delay. The conduction detection circuit 10 may sense the collector-emitter voltage (Vice) of a local switch, such as an insulated-gate bipolar transistor (IGBT) 18 and may determine if (1) the IGBT 18 is conducting, (2) the diode 20 is conducting or (3) neither (high impedance). The actual function of the CDC 10 may be accomplished by determining the polarity of a collector-emitter signal 22 (through the use of a window comparator circuit, for example) as summarized below.

| State | Switch Conduction State | Polarity of Vce | Comment |
|---|---|---|---|
| State 1 | IGBT Conducting | + (low value) | Differential Voltage across the switch is positive as current flows through the IGBT. A low and positive polarity voltage is applied to the CDC circuit. The actual voltage is set by the saturation voltage of the switch for the given operating conditions. |
| state 2 | Diode Conducting | − (low value) | Differential Voltage across the switch is negative as current flows through the diode. A low and negative polarity voltage is applied to the CDC circuit. The actual voltage is set by the forward voltage of the diode for the given operating conditions. |
| state 3 | Device OFF | HIGH IMPEDANCE | Current does not flow through switch. A high and positive polarity voltage is applied to the CDC circuit through a pull-up resistor. |

Various inventive features are described below that can each be used independently of one another or in combination with other features.

Broadly, embodiments of the present invention provide deadtime optimization apparatus and methods that may determine when it is safe to turn a switch ON, eliminating the need to have a switch controller purposely insert a deadtime period in the algorithm (i.e., it can go back to producing ideal PWM). Since the decision of when it is safe to turn ON the switch may be achieved through measurement, it is expected that the length of time may change for each pulse as the operating conditions change. Therefore, the apparatus and methods of the present invention may take on a dynamic characteristic because the safe to turn ON (STTO) time may vary for each pulse.

The apparatus and methods of the present invention may provide a conduction detection circuit capable of detecting three states of the switch, (i) switch conducting, (ii) anti-parallel diode conduction, and (iii) high impedance. The conduction detecting circuit may minimize the length of deadtime to an optimal value for a given operating condition, rather than a fixed time as may be used in the prior art. The dynamic deadtime optimization, according to an exemplary embodiment, may work to ensure the optimal minimum deadtime value is maintained for the given operating conditions while not causing a large impact on DC bus utilization (as compared to industry popular deadtime compensation methods). The dynamic deadtime optimization, according to an exemplary embodiment, may decrease low frequency harmonics at an AC output terminal, decrease output voltage nonlinearity, and enhance fault protection and monitoring.

Figure 3:
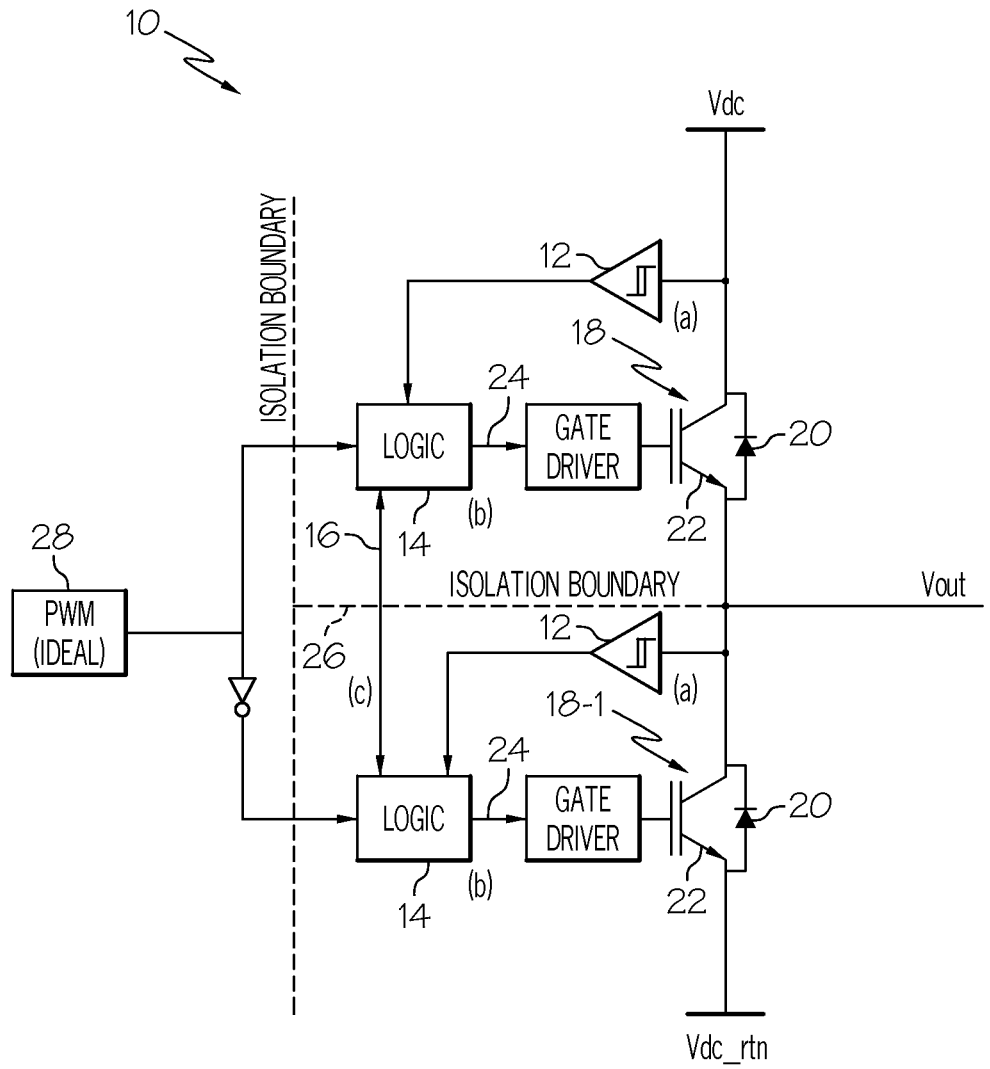
FIG. 3 is a schematic drawing of a conduction detection circuit added to a phase leg in accordance with an embodiment of the present invention.

Referring to FIG. 3, a conduction detection circuit (CDC) 10 may include comparator circuitry 12 (voltage sense), logic circuitry 14 (decision making) and low latency communication 16. The deadtime optimization method must also provide Each signal from the comparator circuitry 12 may be passed to the logic circuitry 14 for a decision gate 24.

The logic circuitry 14 may make at least two decisions. The first logic decision may be to determine if the local switch 18 is in a state which will not cause a shoot-through if the adjacent gate driver 18-1 turns ON. A logical argument which may describe this scenario is given as STTO_a=(!state1 AND state2) OR (!state1 AND state3)

where STTO_a is a "safe to turn ON adjacent switch" bit.

The second logic decision for the logic circuitry 14 may be to detect and hold an ideal PWM 28 (generated externally) until a "safe to turn ON" signal is provided from the adjacent logic gate (STTO_a).

Example of Detailed Implementation

Figure 4:
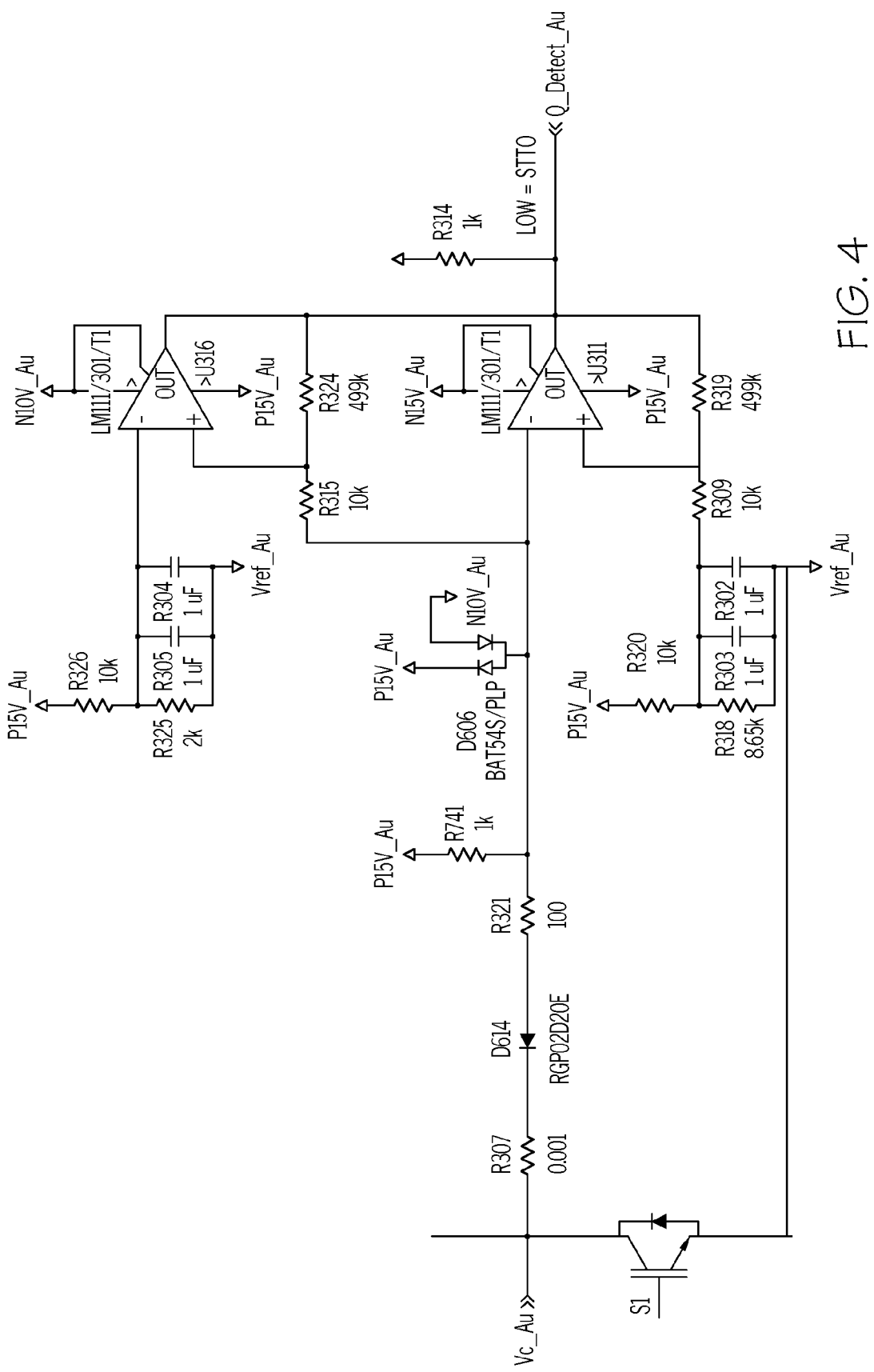
FIG. 4 is a detailed schematic drawing of the comparator circuitry of FIG. 3.

The voltage polarity can be found by the use of a window comparator circuit 30. Comparators are simple devices that can be fast and reliable in the presence of noise. The circuit 30 may make use of LM111 comparators due to their robust nature while meeting the timing requirements. The schematic representing the comparator circuitry 12 of FIG. 3 is shown in FIG. 4.

The comparator circuit 30 may detect three conduction states of the switch—IGBT conducting, DIODE conducting, and device OFF—at the output "Q_Detect_Au" via a typical window comparator implementation.

Figure 5:
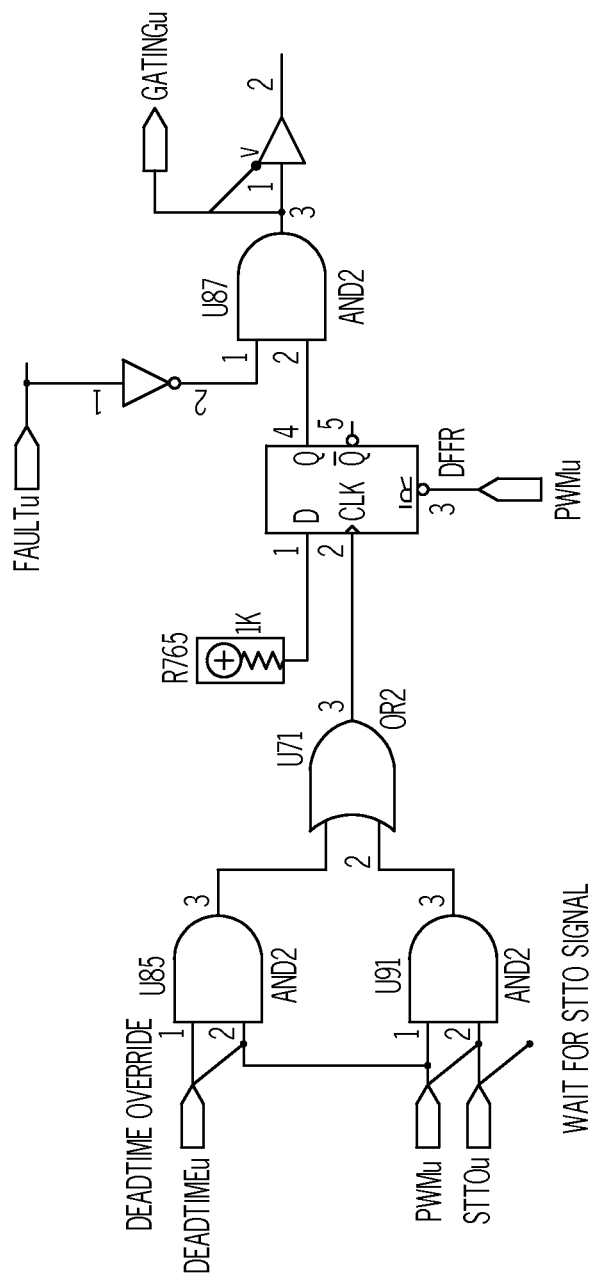
FIG. 5 is a schematic drawing of an IGBT logic used in the circuit of FIG. 3.
Figure 6:
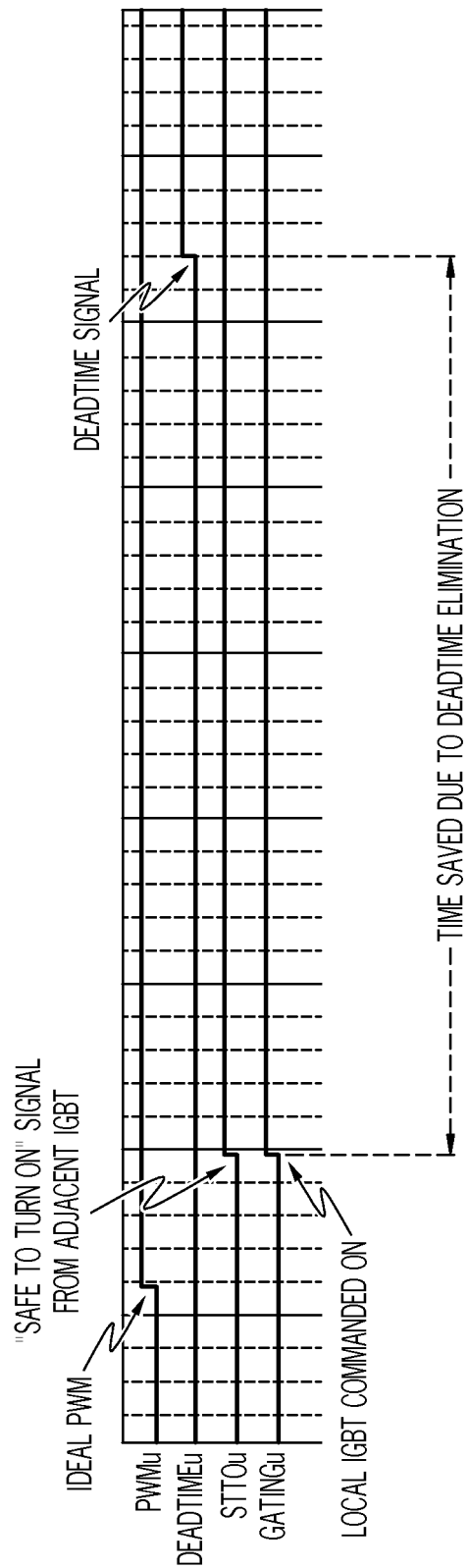
FIG. 6 is a graph comparing the deadtime determined by the present invention as compared to deadtime determined by conventional methods.

The conduction state can be further processed in conjunction with other signals to intelligently decide when it is "safe to turn ON" and when it is not safe. Deciphering the conduction detection circuit signals can be processed through a simple logic device. This logic may perform the function of taking all of the available input signals (including the conduction detection circuit 10, previously discussed) and determining if it is "safe to turn ON" (STTO) the IGBT 18. Should the conduction detection circuit 10 fail to operate properly (due to very low current or narrow pulse times for example) it may be beneficial to be able to turn ON the IGBT 18 anyway, after a set deadtime period. Hence, the STTO circuit may turn ON the IGBT 18 if it receives a "safe to turn ON signal" (i.e., according to exemplary embodiments of the present invention) or failing that, will default to an arbitrary delay of the deadtime period and force a turn ON (i.e. conventional methods). One example of the logic circuit 14 along with its simulated results used to implement this function is shown in FIGS. 5 and 6.

Figure 7:
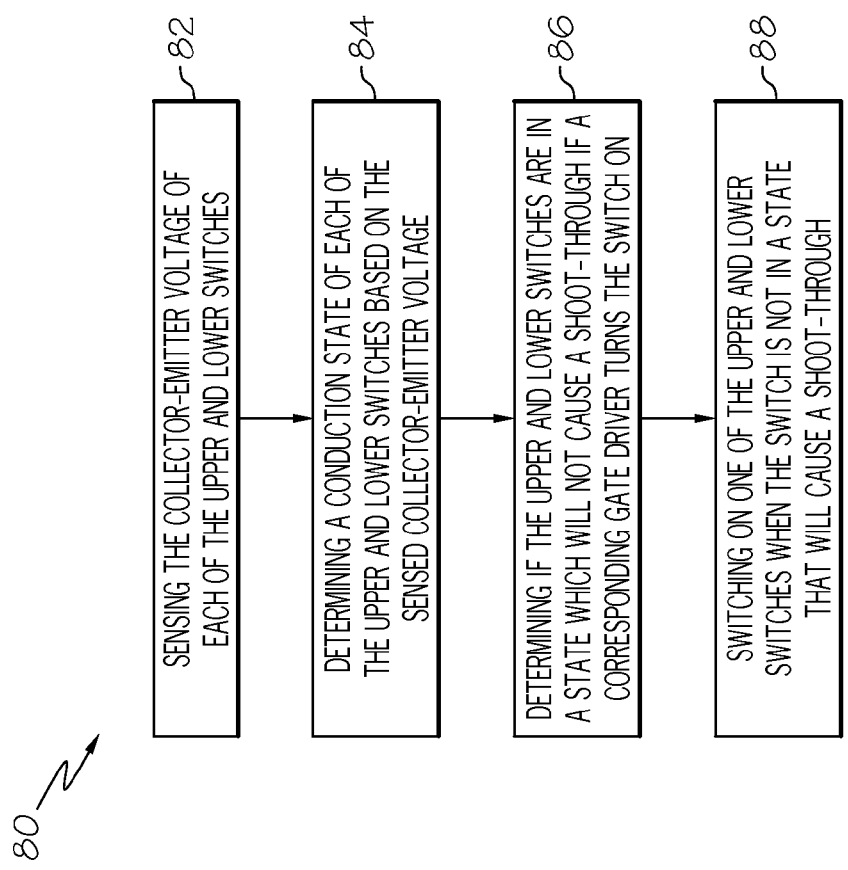
FIG. 7 is a flow chart describing a method according to an embodiment of the present invention.

Referring to FIG. 7, a flow chart 80 is shown describing a method according to an exemplary embodiment of the present invention. A step 82 may sense the collector-emitter voltage of each of the upper and lower switches (e.g., IGBT 18, 18-1). A step 84 may determine a conduction state of each of the upper and lower switches based on the sensed collector-emitter voltage. A step 86 may determine if the upper and lower switches are in a state which will not cause a shoot-through if a corresponding gate driver turns the switch ON. Finally, a step 88 may switch ON one of the upper and lower switches when the switch is not in a state that will cause a shoot-through.

Concept Validation

Figure 8:
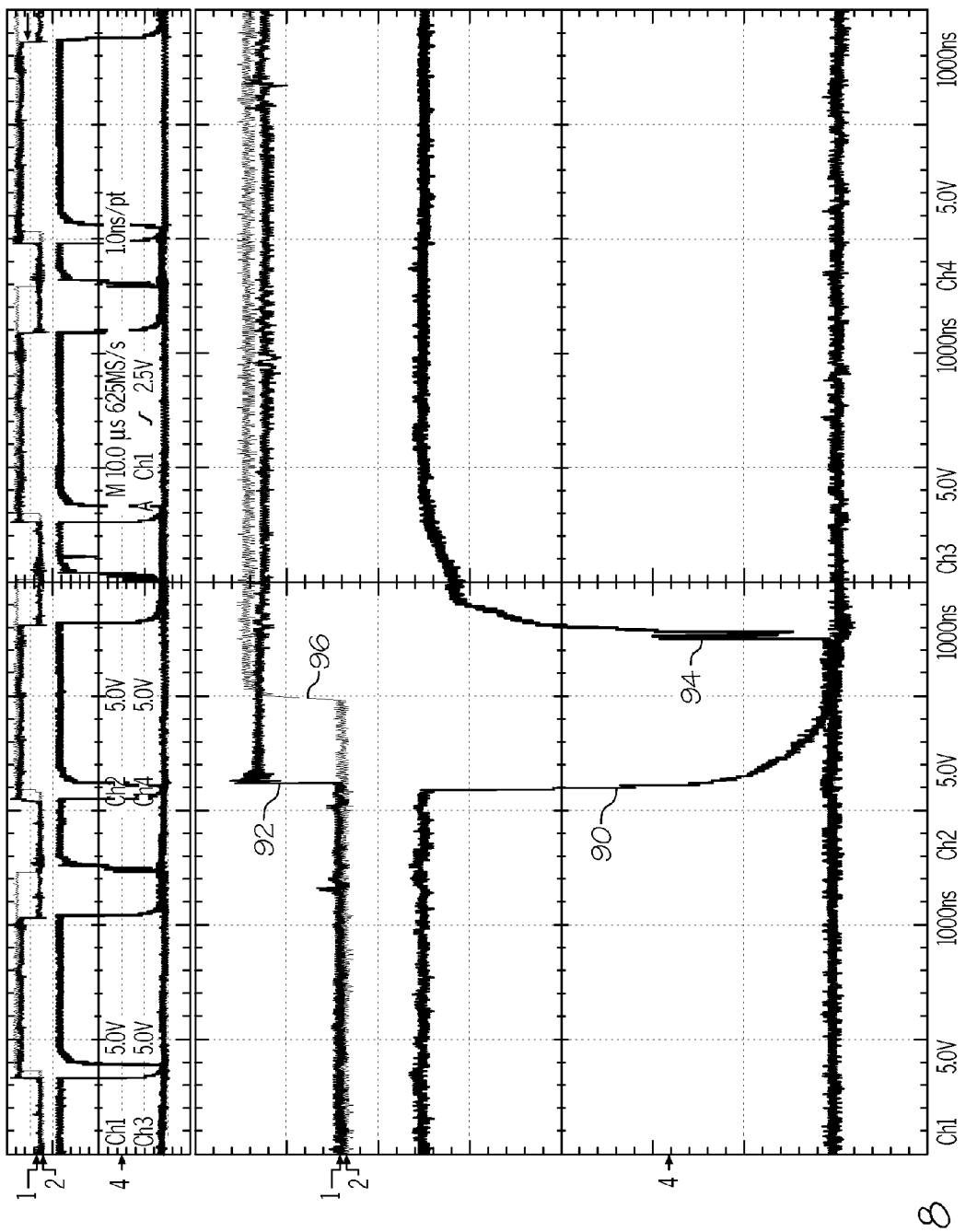
FIG. 8 is a screen shot showing bench tests results for deadtime using the circuit of FIG. 3.

In addition to PSpice simulation and mathematical analysis, the apparatus and methods of the present invention were also tested in a laboratory setting. Laboratory results of the deadtime optimization can be seen below in FIG. 8.

A lower IGBT gate signal 90 shows the measured lower IGBT gate-emitter signal. When this signal goes low, a complimentary signal 92 should go high. Since the digital controller is using ideal PWM generation with no deadtime insertion, one expects the lower IGBT and the upper IGBT to change states at the same time. When the upper IGBT transitions to HIGH (signal 92), this indicates to the local gate driver that it should turn ON "when it is safe to do so". The laboratory testing shows that the upper IGBT gate-emitter signal 94 does not transition to a HIGH immediately as the local gate driver logic (FIG. 5) is waiting for a signal 96 from the adjacent gate driver to indicate when it is safe to turn ON. Even though the measured gate-emitter voltage of the lower IGBT (signal 90) transitions from HIGH to LOW; the gate driver did not determine that it was actually OFF until approximately 800 ns later, at which point the "Safe to Turn ON" signal 96 goes HIGH. The adjacent gate driver receives this "Safe to Turn ON" signal through an isolation barrier 26 (see FIG. 3) and passes it to the local gate driver logic. Now that the gate driver logic has received a PWM HIGH signal (signal 92) and a "Safe to Turn ON" signal (signal 96) it is now free to issue a HIGH gate signal (signal 94). It is important to note that if the "Safe to Turn ON" signal 96 fails to materialize, the logic may automatically revert to inserting an arbitrary delay of 4 μs (user programmable). As a result, the deadtime has been minimized from 4 μs to 1.25 μs for the given operating conditions at that moment in time. Testing also revealed that the deadtime minimization varies pulse-to-pulse as each scenario is assessed individually. The optimized deadtime period is therefore dynamic to the needs of the module as the operating and environmental conditions vary.

It should be understood, of course, that the foregoing relates to exemplary embodiments of the invention and that modifications may be made without departing from the spirit and scope of the invention as set forth in the following claims.

We claim:

1. An apparatus for power conversion comprising:
a pulse width modulator (PWM) to generate ideal pulses without deadtime compensation;
upper and lower logic circuits configured to detect pulses from the PWM, the upper logic circuit to hold the detected pulses until the upper logic circuit receives a safe to turn ON (STTO) signal directly from the lower logic circuit through an isolation boundary and the lower logic circuit to hold the detected pulses until the lower logic circuit receives a STTO signal from the upper logic circuit;
upper and lower gate drivers configured to receive an output from the respective upper and lower logic circuits;
upper and lower switches configured to receive a gating signal from the respective upper and lower gate drivers; and
upper and lower comparators configured to determine a conduction state of the respective upper and lower switches and associated anti-paralleling diodes based at least partly on collector-emitter voltages of the upper and lower switches, wherein the upper and lower comparators are configured to provide the determined conduction state to the respective upper and lower logic circuits,
wherein the upper and lower logic circuits to control the upper and lower gate drivers according to the determined conduction state, the determined conduction state being one of: the switch is conducting, the diode is conducting, or the switch is off,
wherein the upper and lower logic circuits follow a sequence of determining whether the STTO signal should be sent to one another, the sequence including:
(a) waiting for the STTO signal, wherein generation of the STTO is based on the formula:

$$STTO = (NOT\ state\ 1\ AND\ state\ 2)\ OR\ (NOT\ state\ 1\ AND\ state\ 3);$$

wherein state 1 corresponds to a positive differential voltage across the respective upper or lower switch resulting from the respective upper or lower switch conducting;
wherein state 2 corresponds to a negative differential voltage across the respective switch resulting from an anti-paralleling diode, associated with the respective switch, conducting, the negative differential voltage at a level lower than an input voltage to the respective switch; and
wherein state 3 corresponds to a high impedance across the respective switch resulting from the respective switch being OFF, and
(b) providing the STTO signal if the STTO signal is not received within a preset time period during a deadtime of an ON state between the upper and lower switches.

2. The conduction detection circuit of claim 1, wherein the upper and lower switches are IGBTs.

3. The conduction detection circuit of claim 1, wherein the upper and lower logic circuits can each determine whether its respective upper and lower switch is in a state that will not cause a shoot-through if the respective upper and lower gate driver turns ON.

4. The conduction detection circuit of claim 1, wherein the upper and lower comparators are window comparator circuits.

5. The conduction detection circuit of claim 1, including a low latency communication path between the upper and lower logic circuits.

6. A conduction detection circuit comprising:
   a pulse width modulator (PWM) configured to generate pulses;
   upper and a lower logic circuits capable of detecting and holding the pulse;
   upper and lower gate drivers capable of receiving an output from the respective upper and lower logic circuits;
   upper and lower insulated gate bipolar transistor (IGBTs) capable of receiving a gating signal from the respective upper and lower gate drivers; and
   upper and lower comparators capable of determining the conduction state of the respective upper and lower IGBTs,
   wherein a conduction state of the upper and lower IGBTs is determined at least partly based on a collector-emitter voltage,
   wherein the upper and lower logic circuits are in a direct electrical communication relationship so that each determines whether its respective upper and lower IGBT is in a STTO state which will not cause a shoot-through if an adjacent one of the gate drivers turns ON, and
   wherein a conduction state of the respective upper and lower IGBTs is determined by the parameters of; IGBT NOT conducting (NOT state 1), diode conducting (state 2), and IGBT off (state 3), and
   wherein either one of the IGBTs is turned ON if the STTO signal is not received within a preset period of a deadtime between an ON state of the upper and lower IGBTs.

7. The conduction detection circuit of claim 6, wherein a safe to turn ON (STTO) signal is generated based on the formula:

$$STTO=(\text{NOT state 1 AND state 2}) \text{ OR } (\text{NOT state 1 AND state 3});$$

wherein state 1 corresponds to a positive differential voltage present across the respective IGBT;
   wherein state 2 corresponds to a negative differential voltage present across the respective IGBT at a voltage level lower than an input voltage to the respective IGBT; and
   wherein state 3 corresponds to a high impedance being present across the respective IGBT.

8. The conduction detection circuit of claim 7, wherein the upper and lower comparators are window comparator circuits.

9. A method for dynamically optimizing deadtime in switching between upper and lower switches, comprising:
   sensing collector-emitter voltage of each of the upper and lower switches;
   determining a conduction state of each of the upper and lower switches based on the sensed collector-emitter voltage, wherein the conduction state of the respective upper and lower switches is determined by the parameters; IGBT conducting (state 1), diode conducting (state 2) with a negative differential voltage at a voltage level lower than an input voltage to the respective IGBT, and IGBT OFF (state 3);
   determining whether the upper and lower switches are in a state which will not cause a shoot-through if a corresponding gate driver turns the switch ON; and
   switching ON one of the upper and lower switches if a signal indicating whether the upper and lower switches are in a state which will not cause shoot-through is not received within a preset time period during the deadtime.

10. The method of claim 9, including generating a safe to turn ON (STTO) signal based on the logic $$STTO=(\text{NOT state 1 AND state 2}) \text{ OR } (\text{NOT state 1 AND state 3});$$

wherein state 1 corresponds to a presence of positive differential voltage across the respective switch;
   wherein state 2 corresponds to a presence of negative differential voltage across the respective switch; and
   wherein state 3 corresponds to a presence of high impedance across the respective switch.

11. The method of claim 9, wherein the switches are IGBTs.

12. The method of claim 9, including directly communicating between upper and lower logic circuits.

13. The method of claim 12, wherein the upper and lower logic circuits are configured to generate a safe to turn ON (STTO) signal.

* * * * *